(12) United States Patent  
Chen

(10) Patent No.: US 6,558,816 B2
(45) Date of Patent: May 6, 2003

(54) COATED ARTICLE WITH POLYMERIC BASECOAT HAVING THE APPEARANCE OF STAINLESS STEEL

(75) Inventor: Guocun Chen, Broomfield, CO (US)

(73) Assignee: Vapor Technologies, Inc., Boulder, CO (US)

( * ) Notice: Subject to any disclaimer, the term of this patent is extended or adjusted under 35 U.S.C. 154(b) by 0 days.

(21) Appl. No.: 09/827,005

(22) Filed: Apr. 5, 2001

(65) Prior Publication Data

US 2002/0146595 A1 Oct. 10, 2002

(51) Int. Cl.⁷ ............................................. B32B 15/04
(52) U.S. Cl. .................. 428/687; 428/472; 428/621; 428/627; 428/629; 428/632; 428/660; 428/663; 428/698; 428/699; 428/702; 428/413; 428/423.1; 428/469; 428/622; 428/623; 428/628; 428/661; 428/666; 428/701; 428/704
(58) Field of Search .................. 428/472, 621, 428/627, 629, 632, 660, 687, 698, 699, 702, 413, 423.1, 469, 622, 623, 628, 661, 663, 666, 701, 704

(56) References Cited

U.S. PATENT DOCUMENTS

| 5,413,874 A | 5/1995 | Moysan, III et al. |
|---|---|---|
| 5,478,660 A | 12/1995 | Moysan, III et al. |
| 5,482,788 A | 1/1996 | Moysan, III et al. |
| 5,484,663 A | 1/1996 | Moysan, III et al. |
| 5,552,233 A | 9/1996 | Moysan, III et al. |
| 5,626,972 A | 5/1997 | Moysan, III et al. |
| 5,639,564 A | 6/1997 | Moysan, III et al. |
| 5,641,579 A | 6/1997 | Moysan, III et al. |
| 5,648,179 A | 7/1997 | Moysan, III et al. |
| 5,654,108 A | 8/1997 | Moysan, III et al. |
| 5,667,904 A | 9/1997 | Moysan, III et al. |
| 5,814,415 A | 9/1998 | Moysan, III et al. |
| 5,879,532 A * | 3/1999 | Foster et al. ................ 205/192 |
| 5,948,548 A | 9/1999 | Welty et al. |
| 5,985,468 A | 11/1999 | Sugg et al. |
| 5,989,730 A | 11/1999 | Sugg et al. |
| 6,004,684 A | 12/1999 | Sugg et al. |
| 6,033,790 A | 3/2000 | Welty et al. |
| 6,090,490 A | 7/2000 | Mokerji |
| 6,096,426 A | 8/2000 | Mokerji |
| 6,103,381 A | 8/2000 | Mokerji |
| 6,132,889 A | 10/2000 | Welty et al. |
| 6,143,424 A | 11/2000 | Jonte et al. |
| 6,154,311 A * | 11/2000 | Simmons, Jr. et al. ...... 359/359 |
| 6,168,242 B1 | 1/2001 | Mokerji |
| 6,170,487 B1 * | 1/2001 | Ishiguro et al. ............. 128/897 |
| 6,196,936 B1 * | 3/2001 | Meckel ....................... 473/349 |
| 6,242,100 B1 | 6/2001 | Mokerji |
| 6,268,060 B1 | 7/2001 | Mokerji |

* cited by examiner

Primary Examiner—Deborah Jones
Assistant Examiner—Andrew T Piziali
(74) Attorney, Agent, or Firm—Lloyd D. Doigan

(57) ABSTRACT

An article is coated with a multi-layer decorative and protective coating having the appearance of stainless steel. The coating comprises a polymeric layer on the surface of said article and vapor deposited on the polymeric layer a stack layer containing layers of refractory metal or metal alloy alternating with layers containing the reaction products of refractory metal or refractory metal alloy, nitrogen and oxygen wherein the total nitrogen and oxygen content of these reaction products is from about 4 to about 32 atomic percent, with the nitrogen content being at least about 3 atomic percent.

6 Claims, 2 Drawing Sheets

COATED ARTICLE WITH POLYMERIC BASECOAT HAVING THE APPEARANCE OF STAINLESS STEEL

FIELD OF THE INVENTION

This invention relates to articles, particularly brass articles, coated with a multi-layered decorative and protective coating having the appearance or color of stainless steel.

BACKGROUND OF THE INVENTION

It is currently the practice with various brass articles such as faucets, faucet escutcheons, door knobs, door handles, door escutcheons and the like to first buff and polish the surface of the article to a high gloss and to then apply a protective organic coating, such as one comprised of acrylics, urethanes, epoxies and the like, onto this polished surface. This system has the drawback that the buffing and polishing operation, particularly if the article is of a complex shape, is labor intensive. Also, the known organic coatings are not always as durable as desired, and are susceptible to attack by acids. It would, therefore, be quite advantageous if brass articles, or indeed other articles, either plastic, ceramic, or metallic, could be provided with a coating which provided the article with a decorative appearance as well as providing wear resistance, abrasion resistance and corrosion resistance. It is known in the art that a multi-layered coating can be applied to an article which provides a decorative appearance as well as providing wear resistance, abrasion resistance and corrosion resistance. This multi-layer coating includes a decorative and protective color layer of a refractory metal nitride such as a zirconium nitride or a titanium nitride. This color layer, when it is zirconium nitride, provides a brass color, and when it is titanium nitride provides a gold color.

U.S. Pat. Nos. 5,922,478; 6,033,790 and 5,654,108, inter alia, describe a coating which provides an article with a decorative color, such as polished brass, and also provides wear resistance, abrasion resistance and corrosion resistance. It would be very advantageous if a coating could be provided which provided substantially the same properties as the coatings containing zirconium nitride or titanium nitride but instead of being brass colored or gold colored was stainless steel colored. The present invention provides such a coating.

SUMMARY OF THE INVENTION

The present invention is directed to an article such as a plastic, ceramic or metallic article having a decorative and protective multi-layer coating deposited on at least a portion of its surface. More particularly, it is directed to an article or substrate, particularly a metallic article such as aluminum, brass or zinc, having deposited on its surface multiple superposed layers of certain specific types of materials. The coating is decorative and also provides corrosion resistance, wear resistance and abrasion resistance. The coating provides the appearance of stainless steel, i.e. has a stainless steel color tone. Thus, an article surface having the coating thereon simulates a stainless steel surface.

The article first has deposited on its surface a polymeric basecoat layer. On top of the polymeric basecoat layer is then deposited, by vapor deposition such as physical vapor deposition, a sandwich or stack layer. More particularly, a first layer deposited directly on the surface of the substrate is comprised of a polymer. Disposed over the polymeric layer is a vapor deposited protective sandwich or stack layer comprised of layers containing a refractory metal or refractory metal alloy alternating with layers containing a refractory metal nitrogen and oxygen containing compound or a refractory metal alloy nitrogen and oxygen containing compound. Over the sandwich or stack layer is a color layer comprised of a refractory metal nitrogen and oxygen containing compound or a refractory metal alloy nitrogen and oxygen containing compound. The refractory metal nitrogen and oxygen containing compounds or refractory metal alloy nitrogen and oxygen containing compounds are the reaction products of a refractory metal or refractory metal alloy, oxygen and nitrogen, wherein the nitrogen and oxygen content is low, i.e., substoichiometric. The total nitrogen and oxygen content of these refractory metal nitrogen and oxygen containing compounds or refractory metal alloy nitrogen and oxygen containing compound is from about 4 to about 32 atomic percent, preferably from about 5 to about 28 atomic percent, with the nitrogen content being at least about 3 atomic percent, preferably at least about 4 atomic percent.

DESCRIPTION OF THE PREFERRED EMBODIMENT

Figure 1:
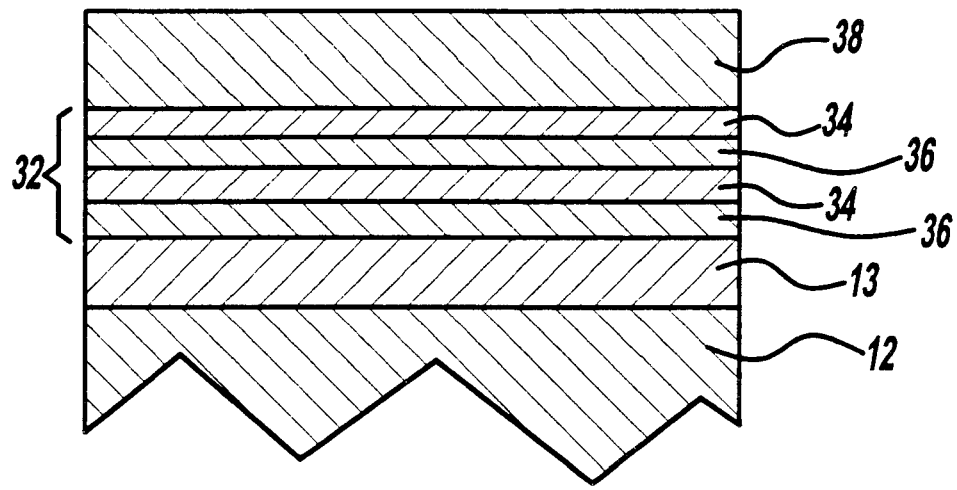
FIG. 1 is a cross sectional view, not to scale, of a portion of the substrate having a multi-layer coating comprising a polymeric basecoat, a protective sandwich or stack layer on the polymeric basecoat layer and a color layer on the stack layer.

The article or substrate 12 can be comprised of any material onto which a plated layer can be applied, such as plastic, e.g., ABS, polyolefin, polyvinylchloride, and phenolformaldehyde, ceramic, metal or metal alloy. In one embodiment it is comprised of a metal or metallic alloy such as copper, steel, brass, zinc, aluminum, nickel alloys and the like.

In the instant invention, as illustrated in FIGS. 1–4, a polymeric or resinous layer is applied onto the surface of the article. A second layer or series of layers is applied onto the surface of the polymer by vapor deposition. The polymeric layer serves, inter alia, as a basecoat which levels the surface of the article.

The polymeric basecoat layer 13 may be comprised of both thermoplastic and thermoset polymeric or resinous material. These polymeric or resinous materials include the well known, conventional and commercially available polycarbonates, epoxy urethanes, polyacrylates, polymethacrylates, nylons, polyesters, polypropylenes, polyepoxies, alkyds and styrene containing polymers such as polystyrene, styrene-acrylonitrile (SAN), styrene-butadiene, acrylonitrile-butadiene-styrene (ABS), and blends and copolymers thereof.

The polycarbonates are described in U.S. Pat. Nos. 4,579,910 and 4,513,037, both of which are incorporated herein by reference.

Nylons are polyamides which can be prepared by the reaction of diamines with dicarboxylic acids. The diamines and dicarboxylic acids which are generally utilized in preparing nylons generally contain from two to about 12 carbon atoms. Nylons can also be prepared by additional polymerization. They are described in "Polyamide Resins", D. E. Floyd, Reinhold Publishing Corp., New York, 1958, which is incorporated herein by reference.

The polyepoxies are disclosed in "Epoxy Resins", by H. Lee and K. Neville, McGraw-Hill, New York, 1957, and in U.S. Pat. Nos. 2,633,458; 4,988,572; 4,680,076; 4,933,429 and 4,999,388, all of which are incorporated herein by reference.

The polyesters are polycondensation products of an aromatic dicarboxylic acid and dihydric alcohol. The aromic dicarboxylic acids include terephthalic acid, isophthalic acid, 4,4'-diphenyl-dicarboxylic acid, 2,6-naphthalenedicarboxylic acid, and the like. Dihydric alcohols include the lower alkane diols with from two to about 10 carbon atoms such as, for example, ethylene glycol, propylene glycol, cyclohexanedimethanol, and the like. Some illustrative non-limiting examples of polyesters include polyethylene terephthalate, polybutylene terephthalate, polyethylene isophthalate, and poly(1,4-cyclohexanedimethylene terephthalate). They are disclosed in U.S. Pat. Nos. 2,645,319; 2,901,466 and 3,047,539, all of which are incorporated herein by reference.

The polyacrylates and polymethacrylates are polymers or resins resulting from the polymerization of one or more acrylates such as, for example, methyl acrylate, ethyl acrylate, butyl acrylate, 2-ethylhexyl acrylate, etc., as well as the methacrylates such as, for instance, methyl methacrylate, ethyl methacrylate, butyl methacrylate, hexyl methacrylate, etc. Copolymers of the above acrylate and methacrylate monomers are also included within the term "polyacrylates or polymethacrylates" as it appears therein. The polymerization of the monomeric acrylates and methacrylates to provide the polyacrylate resins useful in the practice of the invention may be accomplished by any of the well known polymerization techniques.

The styrene-acrylonitrile and acrylonitrile-butadiene-styrene resins and their preparation are disclosed, inter alia, in U.S. Pat. Nos. 2,769,804; 2,989,517; 2,739,142; 3,991,136 and 4,387,179, all of which are incorporated herein by reference.

The alkyd resins are disclosed in "alkyd Resin Technology", Patton, Interscience Publishers, New York, N.Y., 1962, and in U.S. Pat. Nos. 3,102,866; 3,228,787 and 4,511,692, all of which are incorporated herein by reference.

The epoxy urethanes and their preparation are disclosed, inter alia, in U.S. Pat. Nos. 3,963,663; 4,705,841; 4,035,274; 4,052,280; 4,066,523; 4,159,233; 4,163,809; 4,229,335 and 3,970,535, all of which are incorporated by reference. Particularly useful epoxy urethanes are those that are electrocoated onto the article. Such electrodepositable epoxy urethanes are described in the afore-mentioned U.S. Pat. Nos. 3,963,663; 4,066,523; 4,159,233; 4,035,274 and 4,070,258.

These polymeric materials may optionally contain the conventional and well known fillers such as mica, talc and glass fibers.

The polymeric basecoat layer 13 may be applied onto the surface of the substrate by any of the well known and conventional methods such as dipping, spraying, brushing and electrodeposition.

The polymeric layer 13 functions, inter alia, to level the surface of the substrate, cover any scratches or imperfections in the surface of the article and provide a smooth and even surface for the deposition of the succeeding layers such as the vapor deposited layers.

The polymeric basecoat layer 13 has a thickness at least effective to level out the surface of the article or substrate. Generally, this thickness is at least about 0.12 $\mu$m, preferably at least about 2.5 $\mu$m, and more preferably at lest about 5 $\mu$m. The upper thickness range should not exceed about 250 $\mu$m.

In some instances, depending on the substrate material and the type of polymeric basecoat, the polymeric basecoat does not adhere sufficiently to the substrate. In such a situation a primer layer is deposited on the substrate to improve the adhesion of the polymeric basecoat to the substrate. The primer layer can be comprised, inter alia, of halogenated polyolefins. The halogenated polyolefins are conventional and well known polymers that are generally commercially available. The preferred halogenated polyolefins are the chlorinated and brominated polyolefins, with the chlorinated polyolefins being more preferred. The halogenated, particularly chlorinated, polyolefins along with methods for their preparation are disclosed, inter alia, in U.S. Pat. Nos. 5,319,032; 5,840,783; 5,385,979; 5,198,485; 5,863,646; 5,489,650 and 4,273,894, all of which are incorporated herein by reference.

The thickness of the primer layer is a thickness effective to improve the adhesion of the polymeric basecoat layer to the substrate. Generally this thickness is at least about 0.25 $\mu$m. The upper thickness is not critical and generally is controlled by secondary considerations such as cost and appearance. Generally an upper thickness of about 125 $\mu$m should not be exceeded.

Figure 3:
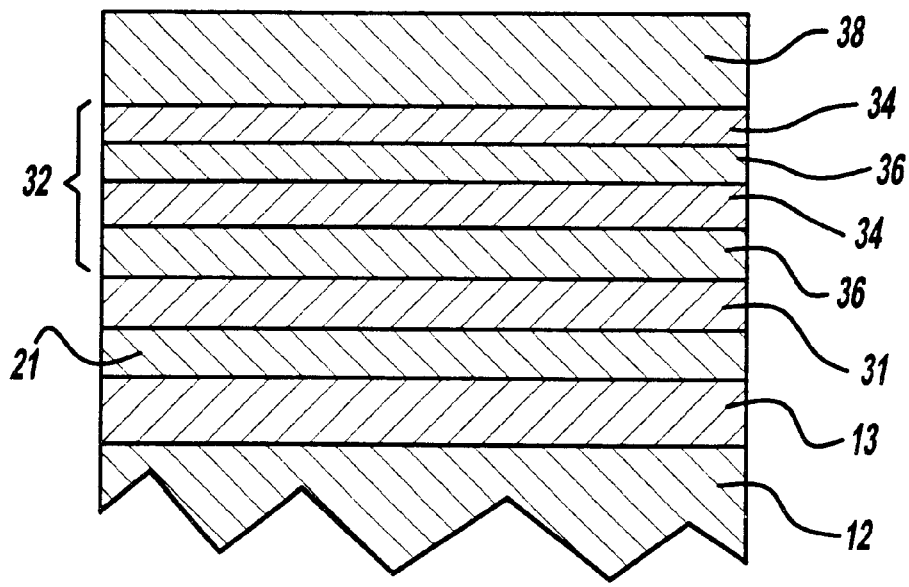
FIG. 3 is a view similar to FIG. 2 except that a chromium layer is present intermediate the polymeric layer and the stack layer.

In one embodiment, as illustrated in FIG. 3, disposed between the polymeric layer 13 and the vapor deposited layers are one or more electroplated layers 21. These electroplated layers include but are not limited to chromium, tin-nickel alloy, and the like. When layer 21 is comprised of chromium it may be deposited on the nickel layer 13 by conventional and well known chromium electroplating techniques. These techniques along with various chrome plating baths are disclosed in Brassard, "Decorative Electroplating—A Process in Transition", Metal Finishing, pp. 105–108, Jun. 1988; Zaki, "Chromium Plating", PF Directory, pp. 146–160; and in U.S. Pat. Nos. 4,460,438; 4,234,396; and 4,093,522, all of which are incorporated herein by reference.

Chrome plating baths are well known and commercially available. A typical chrome plating bath contains chromic acid or salts thereof, and catalyst ion such as sulfate or fluoride. The catalyst ions can be provided by sulfuric acid or its salts and fluosilicic acid. The baths may be operated at a temperature of about 112°–116° F. Typically in chrome plating a current density of about 150 amps per square foot, at about 5 to 9 volts is utilized.

The chrome layer generally has a thickness of at least about 0.05 $\mu$m, preferably at least about 0.12 $\mu$m, and more preferably at least about 0.2 $\mu$m. Generally, the upper range of thickness is not critical and is determined by secondary considerations such as cost. However, the thickness of the chrome layer should generally not exceed about 1.5 $\mu$m, preferably about 1.2 $\mu$m, and more preferably about 1 $\mu$m.

Instead of layer 21 being comprised of chromium it may be comprised of tin-nickel alloy, that is an alloy of nickel and tin. The tin-nickel alloy layer may be deposited on the surface of the substrate by conventional and well known tin-nickel electroplating processes. These processes and plating baths are conventional and well known and are disclosed, inter alia, in U.S. Pat. Nos. 4,033,835; 4,049,508; 3,887,444; 3,772,168 and 3,940,319, all of which are incorporated herein by reference.

The tin-nickel alloy layer is preferably comprised of about 60–70 weight percent tin and about 30–40 weight percent nickel, more preferably about 65% tin and 35% nickel representing the atomic composition SnNi. The plating bath contains sufficient amounts of nickel and tin to provide a tin-nickel alloy of the afore-described composition.

A commercially available tin-nickel plating process is the NiColloy™ process available from ATOTECH, and described in their Technical Information Sheet No: NiColloy, Oct. 30, 1994, incorporated herein by reference.

The thickness of the tin-nickel alloy layer 21 is generally at least about 0.25 µm, preferably at least about 0.5 µm, and more preferably at least about 1.2 µm. The upper thickness range is not critical and is generally dependent on economic considerations. Generally, a thickness of about 50 µm, preferably about 25 µm, and more preferably about 15 µm should not be exceeded.

Over the polymeric layer, or electroplated layer if present, is deposited, by vapor deposition such as physical vapor deposition and chemical vapor deposition, preferably physical vapor deposition, at least a sandwich or stack layer 32 comprised of layers 34 comprising a refractory metal or a refractory metal alloy alternating with layers 36 comprised of a refractory metal nitrogen and oxygen containing compound or a refractory metal alloy nitrogen and oxygen containing compound.

The refractory metals and refractory metal alloys comprising layers 34 include hafnium, tantalum, titanium, zirconium, zirconium-titanium alloy, zirconium-hafnium alloy, and the like, preferably hafnium, titanium, zirconium or zirconium-titanium alloy.

The refractory metal nitrogen and oxygen containing compounds and refractory metal alloy nitrogen and oxygen containing compounds comprising layers 36 are the reaction products of a refractory metal or refractory metal alloy, oxygen and nitrogen. In these refractory metal nitrogen and oxygen containing compounds and refractory metal alloy nitrogen and oxygen containing compounds the total nitrogen and oxygen content is from about 4 to about 32 atomic percent, preferably from about 5 to about 28 atomic percent, with the minimum nitrogen content being at least about 3 atomic percent, preferably at least about 4 atomic percent. Thus, for example, the nitrogen content is 6 atomic percent and the oxygen content is 20 atomic percent, the nitrogen content is 8 atomic percent and the oxygen content is 8 atomic percent, the nitrogen content is 15 atomic percent and the oxygen content is 2 atomic percent. Oxygen is generally present in an amount of at least about 1 atomic percent.

The nitrogen content of these reaction products generally contributes, inter alia, to the coating having its stainless steel color. The nitrogen content is from at least about 3 atomic percent to about 22 atomic percent, preferably from at least about 4 atomic percent to about 16 atomic percent. The nitrogen content should not exceed about 22 atomic percent, preferably about 16 atomic percent, or the coating loses its stainless steel appearance and begins to have a nickel color. Thus, the nitrogen content is critical to the coating having a stainless steel color.

The reaction products of the refractory metal or refractory metal alloy, oxygen and nitrogen are generally comprised of the refractory metal oxide or refractory metal alloy oxide, refractory metal nitride or refractory metal alloy nitride, and refractory metal oxy-nitride or refractory metal alloy oxy-nitride. Thus, for example, the reaction products of zirconium, oxygen and nitrogen comprise zirconium oxide, zirconium nitride and zirconium oxy-nitride. These metal oxides and metal nitrides including zirconium oxide and zirconium nitride alloys and their preparation and deposition are conventional and well known, and are disclosed, inter alia, in U.S. Pat. No. 5,367,285, the disclosure of which is incorporated herein by reference.

The sandwich or stack layer 32 generally has an average thickness of from about 500 Å to about 1 µm, preferably from about 0.1 µm to about 0.9 µm, and more preferably from about 0.15 µm to about 0.75 µm. The sandwich or stack layer generally contains from about 4 to about 100 alternating layers 34 and 36, preferably from about 8 to about 50 alternating layers 34 and 36.

Each of layers 34 and 36 generally has a thickness of at least about 15 Å, preferably at least about 30 Å, and more preferably at least about 75 Å. Generally, layers 34 and 36 should not be thicker than about 0.38 µm, preferably about 0.25 µm, and more preferably about 0.1 µm.

A method of forming the stack layer 32 is by utilizing sputtering or cathodic arc evaporation to deposit a layer 34 of refractory metal such as zirconium or titanium followed by reactive sputtering or reactive cathodic arc evaporation to deposit a layer 36 of refractory metal nitrogen and oxygen containing compound or metal alloy nitrogen and oxygen containing compound.

Preferably the flow rate of nitrogen gas and oxygen is varied (pulsed) during vapor deposition, such as reactive sputtering, between zero (no gas is introduced) to the introduction of gas at a desired value to form multiple alternating layers of refractory metal or refractory metal alloy 36 and reaction products of refractory metal or refractory metal alloy, nitrogen and oxygen 34 in the sandwich layer 32.

Over sandwich or stack layer 32 is a color layer 38. The color layer 38 is comprised of the reaction products of a refractory metal or a refractory metal alloy, nitrogen and oxygen. Color layer 38 is comprised of the same nitrogen and oxygen containing compounds as layers 36, e.g., color layer 38 has the same nitrogen and oxygen content as the compounds which comprise layers 36. Color layer 38 has a thickness at least effective to provide color, more specifically a stainless steel color. Generally, this thickness is at least about 25 Å, and more preferably at least about 500 Å. The upper thickness range is generally not critical and is dependent upon secondary considerations such as cost. Generally a thickness of about 0.75 µm, preferably about 0.65 µm, and more preferably about 0.5 µm should not be exceeded.

Varying the amount of oxygen content in the color layer 38 will make the stainless steel color more bluish or yellowish. Increasing the oxygen content will make the color layer have a bluish tint. Lowering the oxygen content will make the color layer have a yellowish tint.

Figure 2:
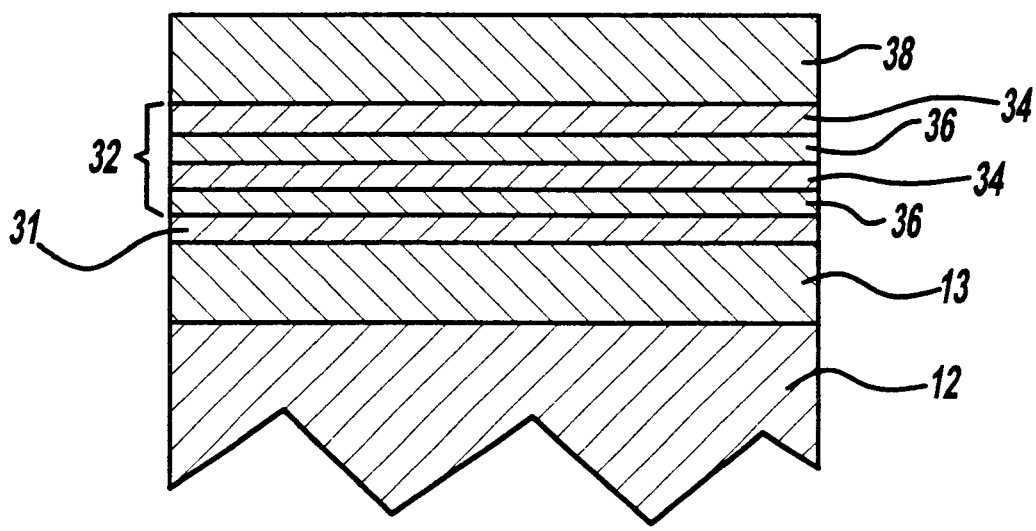
FIG. 2 is a view similar to FIG. 1 except that a refractory metal or refractory metal alloy strike layer is present intermediate the polymeric layer and the sandwich or stack layer.
Figure 4:
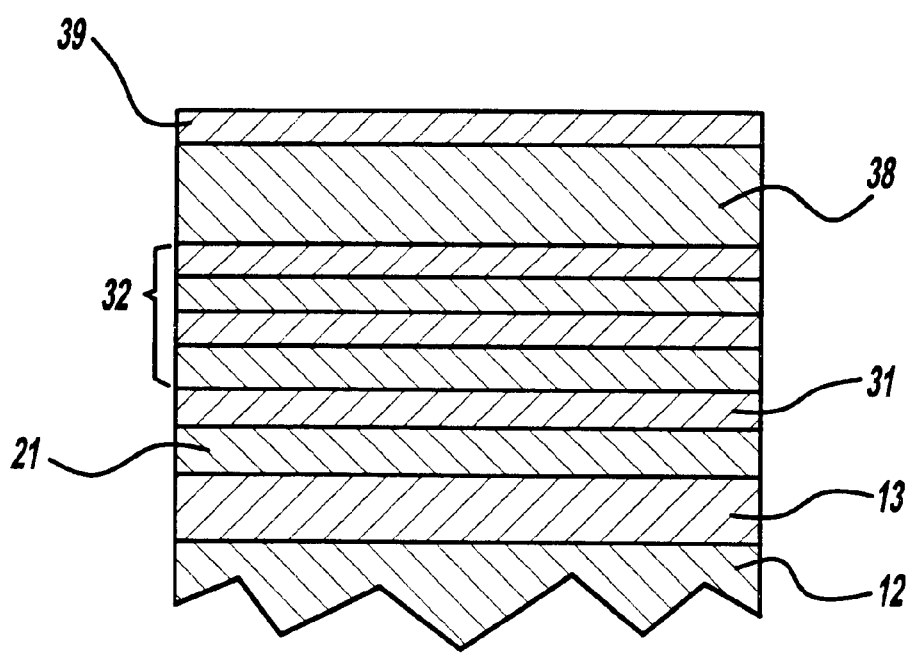
FIG. 4 is a view similar to FIG. 1 except that a refractory metal oxide or a refractory metal alloy oxide layer is present on the color layer.

In addition to the sandwich or stack layer 32 and the color layer 38 there may optionally be present additional vapor deposited layers. These additional vapor deposited layers may include a layer comprised of refractory metal or refractory metal alloy deposited between the stack layer 32 and the polymeric or electroplated layer. The refractory metals include hafnium, tantalum, zirconium and titanium. The refractory metal alloys include zirconium-titanium alloy, zirconium-hafnium alloy and titanium-hafnium alloy. The refractory metal layer or refractory metal alloy layer 31 generally functions, inter alia, as a strike layer which improves the adhesion of the sandwich layer 32 to the polymeric or electroplated layer. As illustrated in FIGS. 2–4, the refractory metal or refractory metal alloy strike layer 31 is generally disposed intermediate the stack layer 32 and the polymeric or electroplated layer. Layer 31 has a thickness which is generally at least effective for layer 31 to function as a strike layer, i.e., to improve the adhesion of the stack layer 32 to the underlying layer. Generally, this thickness is at least about 60 Å, preferably at least about 120 Å, and more preferably at least about 250 Å. The upper thickness range is not critical and is generally dependent upon considerations such as cost. Generally, however, layer 31 should not be thicker than about 1.2 µm, preferably about 0.5 µm, and more preferably about 0.25 µm.

The refractory metal or refractory metal alloy layer 31 is deposited by conventional and well known vapor deposition techniques including physical vapor deposition techniques such as cathodic arc evaporation (CAE) or sputtering. Sputtering techniques and equipment are disclosed, inter alia, in J. Vossen and W. Kern "Thin Film Processes II", Academic Press, 1991; R. Boxman et al, "Handbook of Vacuum Arc Science and Technology", Noyes Pub., 1995; and U.S. Pat. Nos. 4,162,954 and 4,591,418, all of which are incorporated herein by reference.

Briefly, in the sputtering deposition process a refractory metal (such as titanium or zirconium) target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target to dislodge titanium or zirconium atoms. The dislodged target material is then typically deposited as a coating film on the substrate.

In cathodic arc evaporation, an electric arc of typically several hundred amperes is struck on the surface of a metal cathode such as zirconium or titanium. The arc vaporizes the cathode material, which then condenses on the substrates forming a coating.

In a preferred embodiment of the present invention the refractory metal is comprised of titanium, hafnium or zirconium, and the refractory metal alloy is comprised of zirconium-titanium alloy.

The additional vapor deposited layers may also include refractory metal compounds and refractory metal alloy compounds other than the above described reaction products of refractory metal or refractory metal alloy, oxygen and nitrogen. These refractory metal compounds and refractory metal alloy compounds include the refractory metal oxides and refractory metal alloy oxides, the refractory metal carbides and refractory metal alloy carbides, the refractory metal nitrides and refractory metal alloy nitrides, and the refractory metal carbonitrides and refractory metal alloy carbonitrides.

In one embodiment of the invention, as illustrated in FIG. 4, a layer 39 comprised of refractory metal oxide or refractory metal alloy oxide is disposed over color layer 38. The refractory metal oxides and refractory metal alloy oxides of which layer 39 is comprised include, but are not limited to, hafnium oxide, tantalum oxide, zirconium oxide, titanium oxide, and zirconium-titanium alloy oxide, preferably titanium oxide, zirconium oxide, and zirconium-titanium alloy oxide. These oxides and their preparation are conventional and well known.

Layer 39 is effective in providing improved chemical, such as acid or base, resistance to the coating. Layer 39 containing refractory metal oxide or refractory metal alloy oxide generally has a thickness at least effective to provide improved chemical resistance. Generally this thickness is at least about 10 Å, preferably at least about 25 Å, and more preferably at least about 40 Å. Layer 39 should be thin enough so that it does not obscure the color of underlying color layer 38. That is to say layer 39 should be thin enough so that it is non-opaque or substantially transparent. Generally layer 39 should not be thicker than about 0.10 µm, preferably about 250 Å, and more preferably about 100 Å.

The stainless steel color of the coating can be controlled or predetermined by designated stainless steel color standard. In the case where color layer 38 is comprised of the reaction products of a refractory metal or refractory metal alloy, nitrogen and oxygen the stainless steel color may be adjusted to be slightly more yellowish or bluish by an increase or decrease in nitrogen to oxygen ratio in total gas flow. Polished or brushed surface finish of stainless steels may be exactly matched.

In order that the invention may be more readily understood, the following example is provided. The example is illustrative and does not limit the invention thereto.

EXAMPLE 1

Brass faucets are placed in a conventional soak cleaner bath containing the standard and well known soaps, detergents, deflocculants and the like which is maintained at a pH of 8.9–9.2 and a temperature of 180–200° F. for about 10 minutes. The brass faucets are then placed in a conventional ultrasonic alkaline cleaner bath. The ultrasonic cleaner bath has a pH of 8.9–9.2, is maintained at a temperature of about 160–180° F., and contains the conventional and well known soaps, detergents, deflocculants and the like. After the ultrasonic cleaning the faucets are rinsed and dried.

A basecoat polymeric composition is applied onto the cleaned and dried faucets by a standard and conventional high volume low pressure gun. The polymer is comprised of 35 weight percent styrenated acrylic resin, 30 weight percent melamine formaldehyde resin, and 35 weight percent bisphenol A epoxy resin. The polymer is dissolved in sufficient solvents to provide a polymeric composition containing about 43 weight percent solids. After the basecoat is applied onto the faucets the faucets are allowed to sit for 20 minutes for ambient solvent flash off. The faucets are then baked at 375° F. for two hours. The resulting cured polymeric basecoat has a thickness of about 20 µm.

The polymer coated faucets are placed in a cathodic arc evaporation plating vessel. The vessel is generally a cylindrical enclosure containing a vacuum chamber which is adapted to be evacuated by means of pumps. A source of argon gas is connected to the chamber by an adjustable valve for varying the rate of flow of argon into the chamber. In addition, sources of nitrogen and oxygen gases are connected to the chamber by adjustable valves for varying the rates of flow of nitrogen and oxygen into the chamber.

A cylindrical cathode is mounted in the center of the chamber and connected to negative outputs of a variable D.C. power supply. The positive side of the power supply is connected to the chamber wall. The cathode material comprises zirconium.

The coated faucets are mounted on spindles, 16 of which are mounted on a ring around the outside of the cathode. The entire ring rotates around the cathode while each spindle also rotates around its own axis, resulting in a so-called planetary motion which provides uniform exposure to the cathode for the multiple faucets mounted around each spindle. The ring typically rotates at several rpm, while each spindle makes several revolutions per ring revolution. The spindles are electrically isolated from the chamber and provided with rotatable contacts so that a bias voltage may be applied to the substrates during coating.

The vacuum chamber is evacuated to a pressure of about $10^{-5}$ to $10^{-7}$ torr and heated to about 100° C.

The polymer coated faucets are then subjected to a high-bias arc plasma cleaning in which a (negative) bias voltage of about 500 volts is applied to the electroplated faucets while an arc of approximately 500 amperes is struck and sustained on the cathode. The duration of the cleaning is approximately five minutes.

Argon gas is introduced at a rate sufficient to maintain a pressure of about $2\times10^{-1}$ millibars. A stack layer is applied onto the polymer layer. A flow of nitrogen and oxygen is introduced into the vacuum chamber periodically at a flow rate sufficient to provide a nitrogen and oxygen content of about 6 to 16 atomic percent each. This flow of nitrogen is about 4 to 20% of total flow of argon, nitrogen and oxygen, and the flow of oxygen is about 4 to 20% of the total flow of argon, nitrogen and oxygen. The arc discharge continues at approximately 500 amperes during the flow. The nitrogen and oxygen flow rate is pulsed, that is to say it is changed periodically from about 10% to 20% of total flow and a flow rate of about zero. The period for the nitrogen and oxygen pulsing is one to two minutes (30 seconds to one minute on, then off). The total time for pulsed deposition is about 15 minutes resulting in a stack of about 10 to 15 layers of a thickness of about one to about 2.5 Å to about 75 Å for each layer.

After the stack layer is deposited, the nitrogen and oxygen flow rate is left on at a flow rate sufficient to provide a total nitrogen and oxygen content of about 5 to about 28 atomic percent, this nitrogen and oxygen flow rate is about 4 to about 30% of the total flow of argon, nitrogen and oxygen, for a period of time of about 5 to 10 minutes to form the color layer on top of the stack layer. After this color layer is deposited, the flow of nitrogen is terminated and a flow of oxygen of approximately 0.1 standard liters per minute is continued for a time of thirty seconds to one minute. A thin layer of zirconium oxide with thickness of approximately 50 Å–125 Å is formed. The arc is extinguished at the end of this last deposition period, the vacuum chamber is vented and the coated substrates removed.

While certain embodiments of the invention have been described for purposes of illustration, it is to be understood that there may be various embodiments and modifications within the general scope of the invention.

I claim:

1. An article having on at least a portion of its surface a protective and decorative coating having the appearance of stainless steel said coating comprising:

a layer comprised of polymer; and a stack layer comprised of layers comprised of refractory metal or refractory metal alloy alternating with layers comprised of reaction products of refractory metal or refractory metal alloy, nitrogen and oxygen, wherein said refractory metal or refractory metal alloy is selected from the group consisting of hafnium, zirconium, titanium and zirconium-titanium alloy; and a color layer comprised of reaction products of refractory metal or refractory metal alloy, nitrogen and oxygen;

wherein the total nitrogen and oxygen content of said reaction products is a substoichimetric amount of from about 4 to about 32 atomic percent with the nitrogen content being at least about 3 percent.

2. The article of claim 1 wherein said total nitrogen and oxygen content is from about 5 to about 28 atomic percent with the nitrogen content being at least about 4 atomic percent.

3. The article of claim 1 wherein a layer comprised of refractory metal oxide or refractory metal alloy oxide is on said color layer.

4. The article of claim 1 wherein a refractory metal or refractory metal alloy strike layer is on said polymer layer.

5. The article of claim 1 wherein a chromium layer is on said polymer layer.

6. The article of claim 5 wherein a strike layer of refractory metal or refractory metal alloy selected from the group consisting of hafnium, zirconium, titanium and zirconium-titanium alloy is on said chromium layer.

* * * * *